(12) United States Patent
Melvin, III et al.

(10) Patent No.: US 7,966,582 B2
(45) Date of Patent: Jun. 21, 2011

(54) METHOD AND APPARATUS FOR MODELING LONG-RANGE EUVL FLARE

(75) Inventors: Lawrence S. Melvin, III, Hillsboro, OR (US); Brian S. Ward, Austin, TX (US); Kunal N. Taravade, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 608 days.

(21) Appl. No.: 12/126,152

(22) Filed: May 23, 2008

(65) Prior Publication Data

US 2009/0292508 A1 Nov. 26, 2009

(51) Int. Cl.
*G06F 17/50* (2006.01)
(52) U.S. Cl. .......................................... 716/52; 716/136
(58) Field of Classification Search .................. None
See application file for complete search history.

(56) References Cited

U.S. PATENT DOCUMENTS

| | | | | |
|---|---|---|---|---|
| 6,625,802 B2 * | 9/2003 | Singh et al. | ...................... | 716/51 |
| 6,815,129 B1 * | 11/2004 | Bjorkholm et al. | .............. | 430/30 |
| 6,898,781 B2 * | 5/2005 | Singh et al. | ...................... | 716/51 |
| 7,234,130 B2 * | 6/2007 | Word et al. | ...................... | 716/55 |
| 7,343,271 B2 * | 3/2008 | Gallatin et al. | ................... | 703/2 |

OTHER PUBLICATIONS

Kim et al., "Flare mitigation strategies in extreme ultraviolet lithography," Microelectronic Engineering 85, 2008, pp. 738-743.*
Krautschik et al., "Implementing Flare Compensation for EUV Masks Through Localized Mask CD Resizing," Proc. of SPIE vol. 5037, 2003, pp. 58-68.*

\* cited by examiner

*Primary Examiner* — Leigh Marie Garbowski
(74) *Attorney, Agent, or Firm* — Park, Vaughan, Fleming & Dowler LLP; Laxman Sahasrabuddhe

(57) ABSTRACT

One embodiment of the present invention provides techniques and systems for modeling long-range extreme ultraviolet lithography (EUVL) flare. During operation, the system may receive an evaluation point in a layout. Next, the system may receive an EUVL model which includes kernels that are discretized at different sampling rates, and which have different sized ambits. Specifically, a kernel that is discretized using a low sampling rate may have a longer range than a kernel that is discretized using a high sampling rate. The system may then convolve the kernels with the layout at the evaluation point over their respective ambits. Next, the system may use the convolution results to determine an indicator value. The indicator value can be used for a number of applications, e.g., to predict pattern shapes that are expected to print on a wafer, to perform optical proximity correction, or to identify manufacturing problem areas in the layout.

20 Claims, 5 Drawing Sheets

METHOD AND APPARATUS FOR MODELING LONG-RANGE EUVL FLARE

BACKGROUND

1. Field of the Invention

The present invention generally relates to electronic design automation. More specifically, the present invention relates to methods and apparatuses for modeling long-range EUVL (extreme ultraviolet lithography) flare.

2. Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

Conventional photolithography processes are close to reaching their physical limit in terms of the minimum feature size that can be printed with these technologies. Hence, the semiconductor industry is actively considering various next generation photolithography technologies which will enable feature sizes to be miniaturized even further. One of the more promising technologies is extreme ultraviolet lithography (EUVL). EUVL is a 13 nm illumination system that uses grazing incidence optics to project a reticle image onto a wafer.

Process models are commonly used to model semiconductor manufacturing processes. A process model can be used in a number of applications during the design of a semiconductor chip. For example, process models are commonly used for making corrections to layouts to compensate for undesirable effects of semiconductor manufacturing processes.

Inaccuracies in the process model can negatively affect the efficacy of downstream applications. For example, inaccuracies in a photolithography process model can reduce the efficacy of optical proximity correction (OPC). Hence, it is desirable to develop accurate process models for next generation process technologies.

SUMMARY

One embodiment of the present invention provides techniques and systems for modeling EUVL flare. The EUVL flare's point spread function can have significant high frequency components, and hence, the point spread function may need to be discretized using a high sampling rate. However, the EUVL flare can also have a long range, and hence, the point spread function may also need to be modeled and convolved over a large area.

Conventional modeling techniques can result in serious performance problems when they are used to model EUVL flare. Specifically, EUVL models generated using conventional techniques can be inaccurate and/or computationally inefficient. In contrast to conventional techniques, embodiments of the present invention provide systems and techniques for modeling long-range EUVL flare which are both accurate and computationally efficient.

In one embodiment of the present invention, an EUVL system can be modeled using kernels that are discretized using different sampling rates, and which have different sized ambits. Specifically, a kernel that is discretized using a low sampling rate may have a larger ambit (i.e., a longer range) than a kernel that is discretized using a high sampling rate. Note that a kernel can generally be any mathematical modeling function.

Specifically, in one embodiment, the EUVL model can include: a short-range component which includes one or more discretized kernels which are discretized using a high sampling rate over a small-sized ambit, a medium-range component which includes one or more discretized kernels which are discretized using a medium sampling rate over a medium-sized ambit, and a long-range component which is a polynomial function of the layout's pattern density over a large-sized ambit.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
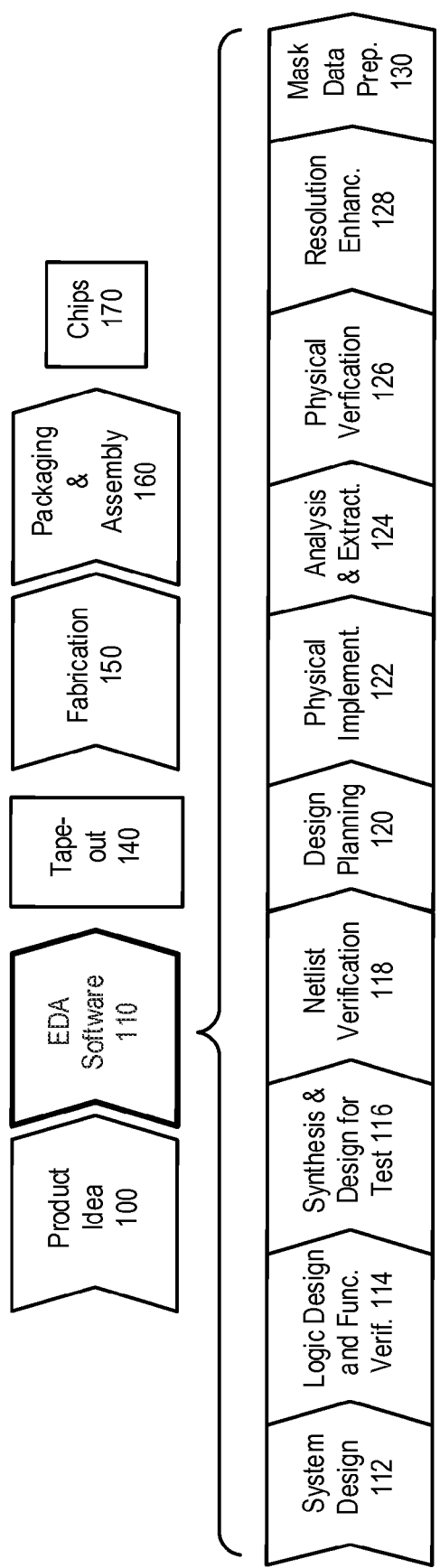
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda®products.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare® products.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this stage, the circuit function is verified at a transistor level; this in turn permits what-if refinement. Exemplary EDA software products from Synopsys, Inc. that can be used at this step include AstroRail™, PrimeRail, PrimeTime®, and Star-RCXT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during the resolution enhancement step 128.

Process Models

A process model models the behavior of one or more semiconductor manufacturing processes which usually involve complex physical and chemical interactions. A process model can be determined by fitting or calibrating kernel coefficients to empirical data. The empirical data is usually generated by applying the semiconductor manufacturing processes that are being modeled to one or more test layouts. For example, a photolithography process can be used to print a test layout on a wafer. Next, the empirical data can be obtained by measuring the critical dimensions (CD) of the features on the wafer before and/or after the etch process. An uncalibrated process model can then be fit to the empirical data to obtain a calibrated process model that models the photolithography process.

Once a process model is determined, it can be used in a number of applications during the design and manufacture of a semiconductor chip. For example, process models are typically used to support Optical Proximity Correction (OPC) and Resolution Enhancement Techniques (RET). These models can allow full-chip database manipulation in reasonable timeframes during the tape-out flow.

An uncalibrated process model typically includes components that are associated with parameters and/or coefficients. During calibration, the parameters and/or coefficients can be statistically fit to empirical data to obtain the final process model. A component in the process model is typically a mathematical expression that is designed to model a particular physical effect. For example, a process model may be represented as $$\sum_i (c_i \cdot k_i),$$

where $k_i$ is a component or kernel, and $c_i$ is a coefficient which is associated with $k_i$. The empirical data may include values of a desired property, e.g., the CD, at different locations in the layout. Once the process model is fit to the empirical data, it can then be used to predict the value of the desired property for other layouts.

It may be impossible to calibrate coefficient values so that the predicted data exactly matches the empirical data. Even if an exact fit was available, it may not be desirable because the resulting process model may not interpolate and/or extrapolate properly. Typically, statistical fitting techniques are used to determine the parameters and/or coefficients so that the error between the empirical data and the predicted data is minimized. In one embodiment, the system can use a least squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Photolithography Process Models

Figure 2:
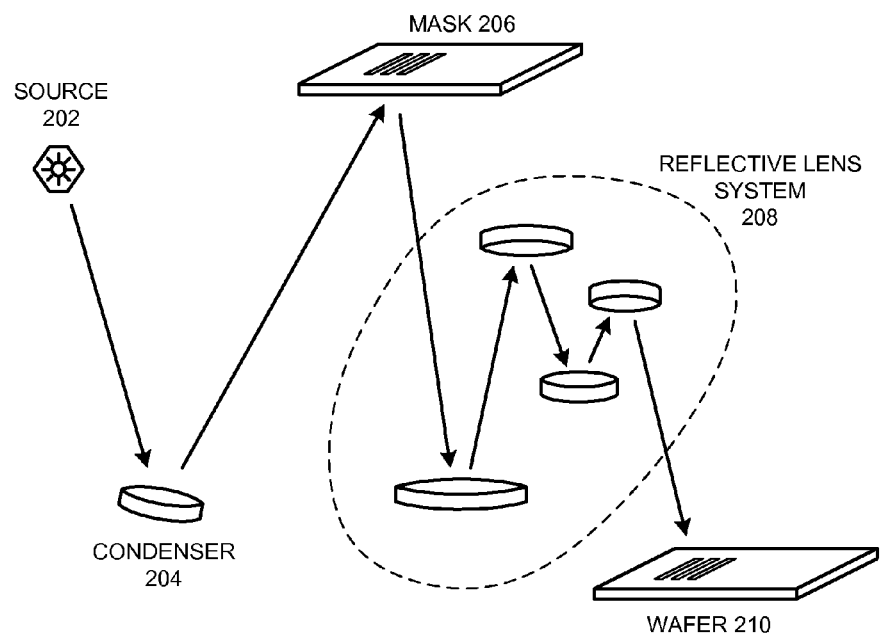
FIG. 2 illustrates an EUVL system in accordance with an embodiment of the present invention.

FIG. 2 illustrates an EUVL system in accordance with an embodiment of the present invention.

EUVL is a potential lithography process for the manufacture of semiconductor chips at and beyond the 22 nm node. EUVL is a 13 nm illumination system that uses grazing incidence optics to project a reticle image onto a wafer. Radiation from source 202 can be focused and reflected by condenser 204. The light can then be reflected by mask 206, and by reflective lens system 208, before imaging on wafer 210.

The optical model in a photolithography process model is usually based on the Hopkins model which models the behavior of partially coherent optical systems. The Hopkins model can be described using the expression:

$$I(x,y) = \iiiint J(x',y';x'',y'') \oplus L(x,y;x',y') \oplus L^*(x,y;x'',y'') dx'dy'dx''dy'',$$

where, I(x, y) is the optical intensity at point (x, y) on the wafer, J(x', y'; x'', y'') models the incoherence between two points of light on the mask, L(x, y; x', y') is a lumped model of the light source and the mask, and L* is the complex conjugate of L. The lumped model (L) essentially treats the mask as an array of light sources. In particular, L(x, y; x', y') models point (x', y') on the mask as a point source, and J(x', y'; x'', y'') models the incoherence between the light emanating from points (x', y') and (x'', y'') on the mask. The lumped model (L) can be represented as a convolution between the mask and the source. For example, the lumped model can be represented using a mask model and a source model as follows:

$$L(x,y;x',y') = M(x',y') \oplus K(x,y;x',y'),$$

where M(x', y') models the mask and K(x, y; x', y') models the source.

The Hopkins model can be used to determine a 4-D (four dimensional) matrix called the Transmission Cross Coefficient (TCC) matrix which models the optical system. The TCC matrix can then be represented using a set of orthogonal 2-D (two dimensional) kernels. The set of orthogonal kernels can be determined using the eigenfunctions of the TCC matrix. The pattern shapes on the wafer can be determined by convolving the set of fitted 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics*, $2^{nd}$ Edition, Dover Publications, 1989.

In one embodiment, the system uses a set of orthogonal functions called Zernike polynomials to represent the optical system. Zernike polynomials are made up of terms that are of the same form as the types of aberrations often observed in optical systems. For example, one Zernike polynomial may be associated with defocus, while another may be associated with tilt, etc. The optical system can be represented using the expression $$\sum_i (c_i \cdot z_i),$$

where $z_i$ is a Zernike polynomial and $c_i$ is an optical coefficient which is associated with $z_i$.

Discretizing a Process Model

A photolithography process model can be used to predict the image intensity at a point on the wafer's surface. Conceptually, to determine the image intensity that is associated with a point in a mask layout, the photolithography process model is convolved with the mask layout at the point. The process model value $V_i[M(x, y)]$ at an evaluation point i can be computed using the following expression:

$$V_i[M(x,y)] = \sum_k \left( \int M(x-x_i, y-y_i) \lambda_k(x,y) dx dy \right)^2,$$

where M(x, y) is a two-dimensional function that represents the mask layout, $x_i$ and $y_i$ are the coordinates of the evaluation point i, and $\lambda_k$ is the $k^{th}$ kernel in the analytical model.

In practice, continuous models are usually discretized to facilitate numerical computations. Specifically, one embodiment of the present invention samples the process model to obtain a discretized counterpart of the process model. Next, the embodiment convolves the discretized process model with the mask layout.

A kernel can be discretized using different sampling rates. The sampling rate determines (a) the amount of memory that is required to represent the kernel, and (b) the amount of computational resources that will be required to convolve the kernel with the layout.

For example, if we sample a kernel over a 10-by-10 micron square at every 0.1 microns (i.e., at a sampling rate of 10 samples per micron), the kernel can be represented using 10,000 sample values. On the other hand, if we sample the same kernel over the same region at every 1 micron (i.e., at a sampling rate of 1 sample per micron), the kernel can be represented using 100 sample values. Note that the number of samples required to represent a kernel can increase as the square of the sampling rate. It will be evident that discretizing a kernel using a higher sampling rate can dramatically increase the amount of computation required to convolve the kernel with a mask layout.

Note that using a higher sampling rate can increase the accuracy of the discretized representation. If the kernel has non-negligible high frequency components (which typically correspond to spikes and/or sharp edges in the space domain), a higher sampling rate may be required to accurately discretize the kernel. On the other hand, if the high frequency components can be neglected, a lower sampling rate may suffice. In particular, the Nyquist sampling theorem states that the sampling rate must be greater than or equal to two times the highest frequency component that needs to be captured during discretization.

Conventional techniques discretize all kernels using the same sampling rate. Unfortunately, this can be problematic when modeling EUVL flare.

Modeling EUVL Flare

All optical systems are usually subject to flare, which is stray light that produces background illumination on the wafer image. The amount and range of the flare is usually a function of the inverse of the wavelength squared.

Specifically, the flare in an EUVL system can be substantially greater both in magnitude and range than the flare in conventional optical systems that use longer wavelengths. EUVL flare can have a range that is at least two orders of magnitude longer than the flare in a conventional 193 nm wavelength system. The flare effects in conventional photolithography systems are typically restricted to a range of 1 micron or less, but in EUVL systems, flare effects are expected to have a range of at least 1 mm, and may even extend beyond 25 mm.

The flare effect can be modeled by convolving a point spread function which represents the flare with the mask layout as shown below:

$$\text{Flare} \approx (\int M(x-x_i, y-y_i) \cdot \text{PSF}(x,y) dx dy)^2,$$

where, PSF(x, y) is the point spread function or the power spectral density of the flare, and M(x, y) is a function that represents the mask. Note that the flare point spread function can be added as a component to a photolithography process model.

Conventional process modeling methodologies are designed to work with kernels whose range is in the order of 1 to 5 microns. However, since EUVL flare effects occur at a range as large as the millimeter level, it introduces computational problems that cannot be addressed using conventional process modeling methodologies. Specifically, if we use conventional techniques to model EUVL flare with a 1 mm or longer range, it may take a few years to run an OPC run-set, which is clearly unacceptable. Hence, conventional process modeling methodologies are inadequate for modeling long-range EUVL flare effects.

A second problem in modeling EUVL flare arises because of the shape of the flare's point spread function and its representation in the frequency domain. The point spread function has a zero in the center, which causes the point spread function's representation in the space domain to have sharp corners and spikes. These corners and spikes give rise to significant high frequency components in the frequency domain. To accurately capture these high frequency components, a high sampling rate may need to be used during discretization. However, as explained above, using a high sampling rate can cause the convolution operation to become computationally expensive.

Figures 3A, 3B:
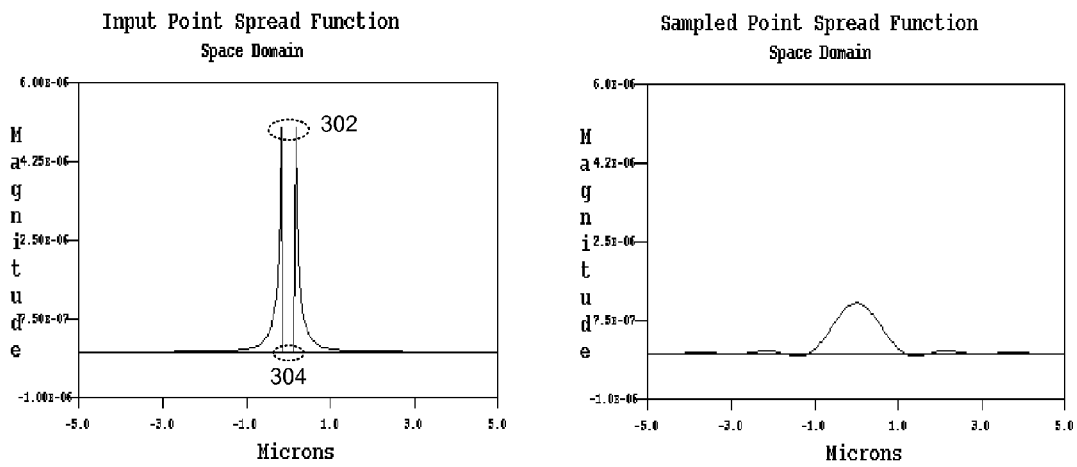
FIG. 3A illustrates an EUVL flare's point spread function in accordance with an embodiment of the present invention.
FIG. 3B illustrates an EUVL flare's point spread function after it is discretized using a low sampling rate in accordance with an embodiment of the present invention.

FIG. 3A illustrates an EUVL flare's point spread function in accordance with an embodiment of the present invention.

Spikes 302 and sharp corners 304 can give rise to significant high frequency components in the frequency domain. The point spread functions may need to be sampled at high sampling rates to preserve these high frequency components.

FIG. 3B illustrates an EUVL flare's point spread function after it is discretized using a low sampling rate in accordance with an embodiment of the present invention. Note that spikes 302 and sharp corners 304 have been lost in the discretized version illustrated in FIG. 3B.

Since the lens usually acts as a band-pass filter, and since the high frequency components of the EUVL flare's point spread function usually fall outside the lens's pass band, most of the high frequency components are usually filtered out by the lens. However, if we don't adequately capture the unfiltered high frequency components, the resulting model may generate inaccurate results.

Hence, modeling the EUVL flare using conventional modeling techniques results in a model that requires a large amount of computational resources because: (1) the flare has high frequency components which need to be discretized using a high sampling rate, and (2) the EUVL flare has long-range effects, and hence, the point spread function needs to be modeled and convolved over a large area.

One embodiment of the present invention uses the following insight to substantially reduce the amount of computational resources required to model EUVL flare effects: the EUVL flare point spread function can be modeled using kernels which are discretized at different sampling rates. Since the high frequency components of the EUVL flare's point spread function operate over a small range, they can be modeled using one or more kernels which are discretized using a high sampling rate. Since these high frequency kernels operate over a small area, convolving these kernels does not require a large amount of computational resources.

On the other hand, since the long-range effects of the EUVL flare are primarily caused by low frequency components of the EUVL flare's point spread function, the long-range effects can be modeled using one or more kernels which are discretized at a low sampling rate. Since the low frequency kernels are discretized at a low sampling rate, the discretized kernels can be applied over a large ambit without requiring a large amount of computational resources.

One embodiment of the present invention represents the EUVL system using three components which are discretized at different sampling rates and which operate over different ranges. These components can be referred to as the long-range flare (FL) component, the medium-range flare (FM) component, and local intensity (IL) component. The EUVL flare model can be represented by adding these individual components, i.e., the EUVL flare model, I, can be represented as I=FL+FM+IL.

FL can be a function of pattern density, i.e., FL=j(p), where p is the pattern density, FM can be a Gaussian kernel, and IL can be a set of kernels that are fit to empirical data to model EUVL optics and chemical effects. The FL component's range can be from 20-100 microns to 20+ mm, the FM component's range can be from 5-10 microns to 20-100 microns, and the IL component's range can be from 0 micron to 5-10 microns.

Since the FL component is a function of the layout density, the density values can be pre-computed and stored in a computer-readable storage medium. The system can measure the density of the full chip, and place it into a density map relative to the position on the chip. The density map can go to each position on the chip and split it into a pixel unit on the order of a micron. At each pixel, the density of the reticle can be calculated within the long range of the flare. In other words, if the FL component's range is 1 mm, the density of the reticle at a pixel can be computed over a circle with a 1 mm radius that is centered at the pixel. The density value can then be stored for later use by the model. For example, the density value can be encoded in a ".gds" file, i.e., the stream file of a GDS II file, or in an OASIS file.

In one embodiment, the three components can be modeled as follows. FL can be modeled as a quadratic function of the pattern density, e.g., $FL=Ap+Bp^2+C$, or it can be modeled using some other straightforward polynomial of pattern density $\rho$. Parameters A, B, and C (or other modifying parameters based on the desired long-range flare function) can be calibrated during model fitting. During operation, the model can lookup the pre-computed pattern density, $\rho$. Modeling FL in this manner can enable this component to be computed quickly.

The FM component can be a Gaussian type function that can be used for modeling medium-range flare. This component can be modeled using one to three kernels, which can be in sparse format. In one embodiment, FM can be convolved with the uncorrected pattern during OPC to save runtime. In other words, the embodiment can convolve the FM component with the uncorrected pattern, even as the pattern is progressively corrected during OPC. The kernels in the FM model can be calibrated during model fitting.

The IL component can model the local intensity. Specifically, this component can model the local flare, the optics, any tilt or curvature correction, photoresist, reticle components, etc. This component can be modeled and fit to empirical data using conventional modeling techniques. During operation, the contributions of all three models can be summed up to produce the final intensity at a point.

In this manner, the amount of computational resources required to use the EUVL flare model can be drastically reduced by eliminating most of the long-range computations. Note that an embodiment of the present invention accurately represents the EUVL flare's point spread function without using long-range high-frequency model components.

Figure 4:
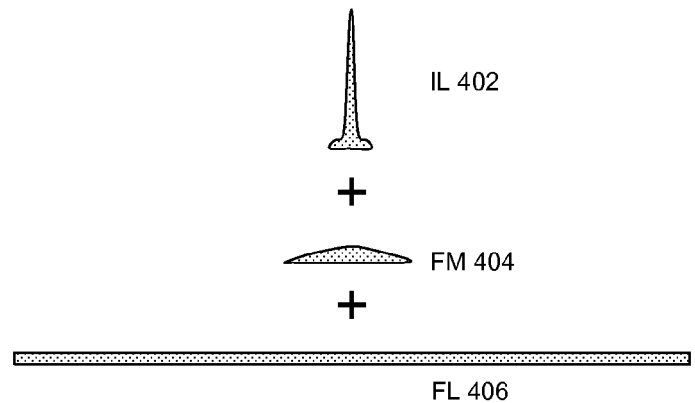
FIG. 4 illustrates three components of an EUVL model in accordance with an embodiment of the present invention.

FIG. 4 illustrates three components of an EUVL model in accordance with an embodiment of the present invention.

The EUVL flare's point spread function can be modeled using local intensity (IL) component 402, short and medium-range flare (FM) component 404, and long-range flare (FL) component 406. Note that the IL component 402 is almost an impulse response compared to the FL component 406.

Figure 5:
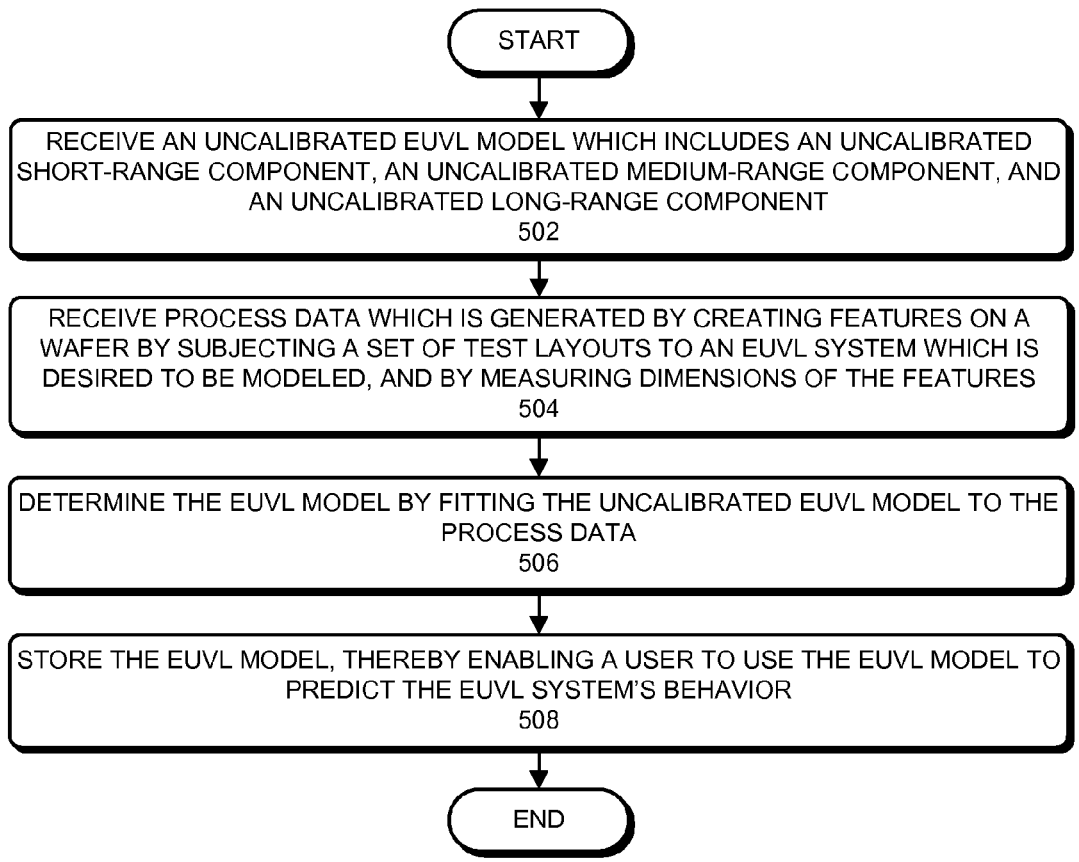
FIG. 5 presents a flowchart that illustrates a process for modeling long-range EUVL flare in accordance with an embodiment of the present invention.

FIG. 5 presents a flowchart that illustrates a process for modeling long-range EUVL flare in accordance with an embodiment of the present invention.

The process can begin by receiving an uncalibrated EUVL model which includes an uncalibrated short-range component, an uncalibrated medium-range component, and an uncalibrated long-range component (step 502).

Each component may be discretized using a different sampling rate, and each component may have a different sized ambit. Specifically, the uncalibrated short-range component can include one or more discretized kernels which are discretized using a high sampling rate over a small-sized ambit, the uncalibrated medium-range component can include one or more discretized kernels which are discretized using a medium sampling rate over a medium-sized ambit, and the uncalibrated long-range component can be a polynomial function of the layout's pattern density over a large-sized ambit.

Next, the system can receive process data which is generated by creating features on a wafer by subjecting a set of test layouts to an EUVL system which is desired to be modeled, and by measuring dimensions of the features (step 504).

The system can then determine the EUVL model by fitting the uncalibrated EUVL model to the process data (step 506). Note that the fitted EUVL model models the EUVL system.

Next, the system can store the EUVL model, thereby enabling a user to use the EUVL model to predict the EUVL system's behavior (step 508). For example, the system can store the kernels (or kernel identifiers) and the associated kernel coefficients on a computer-readable storage medium. The EUVL model can then be used in a number of applications, e.g., the EUVL model can be used for performing OPC.

Figure 6:
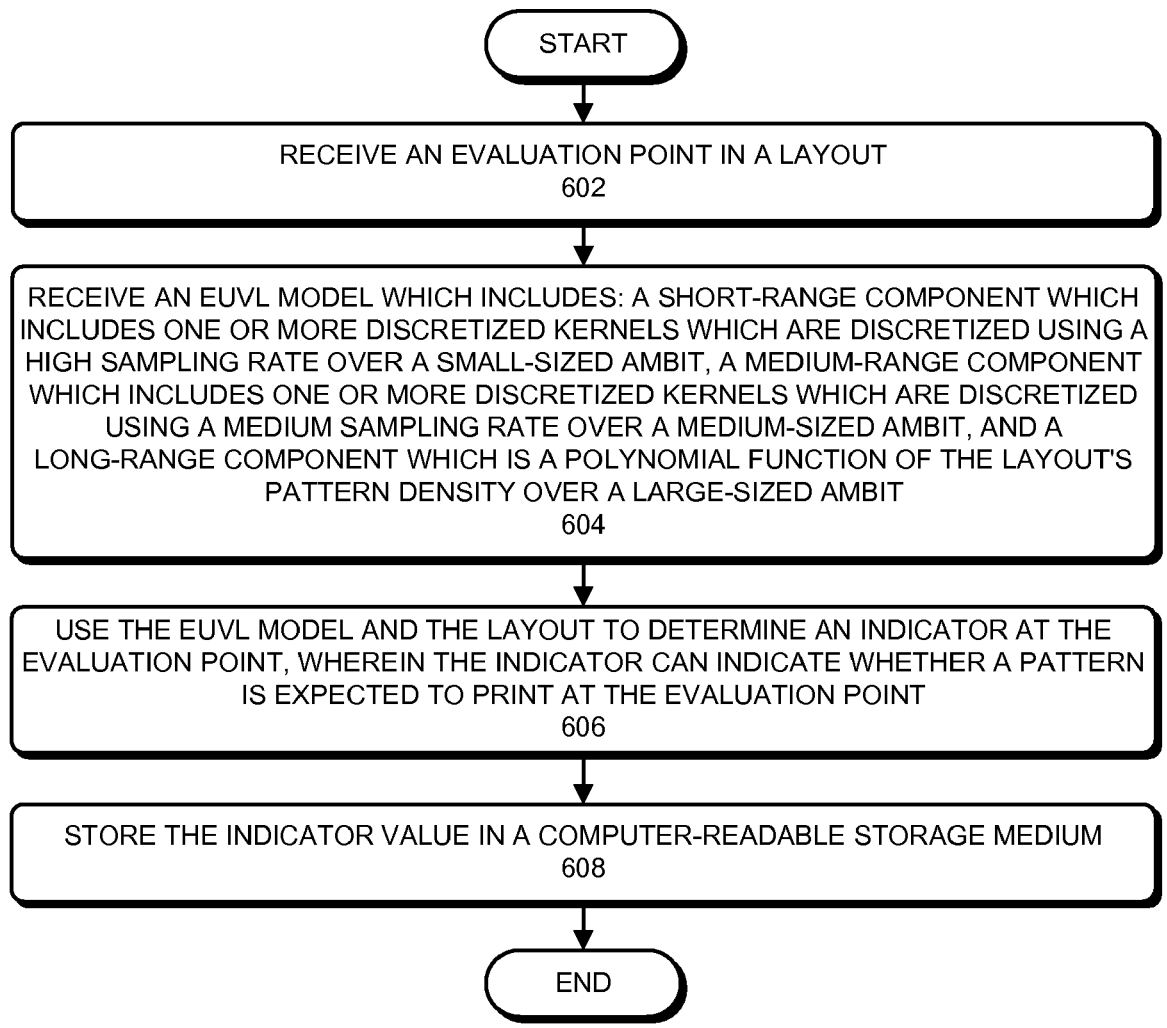
FIG. 6 presents a flowchart that illustrates a process for using an EUVL model in accordance with an embodiment of the present invention.

FIG. 6 presents a flowchart that illustrates a process for using an EUVL model in accordance with an embodiment of the present invention.

The process can begin by receiving an evaluation point in a layout (step 602). The evaluation point can be a location in the layout where we are interested in predicting the EUVL system's effect. For example, the evaluation point may be located on a line-end, and we may be interested in determining whether the line-end will print properly.

Next, the system may receive an EUVL model which includes: a short-range component which includes one or more discretized kernels which are discretized using a high sampling rate over a small-sized ambit, a medium-range component which includes one or more discretized kernels which are discretized using a medium sampling rate over a medium-sized ambit, and a long-range component which is a polynomial function of the layout's pattern density over a large-sized ambit (step 604).

The system can then use the EUVL model and the layout to determine an indicator at the evaluation point, wherein the indicator can indicate whether a pattern is expected to print at the evaluation point (step 606).

Each of the EUVL components can be convolved with the layout at the evaluation point to obtain the value of the indicator. Specifically, the short-range component can be convolved with the layout at the evaluation point over the small-sized ambit to determine the contribution of the short-range component. Similarly, the medium-range component can be convolved with the layout at the evaluation point over the medium-sized ambit to determine the contribution of the medium-range component. The contribution of the long-range component can be determined by evaluating the polynomial function using the layout's long-range pattern density value at the evaluation point. The indicator value can then be computed by adding the contributions of each of the components.

Note that the layout's pattern density values can be pre-computed and stored in a table or a database so that the layout's pattern density value can be quickly determined by looking up the table or by querying the database while evaluating the polynomial function.

The system can then store the indicator value in a computer-readable storage medium (step 608), and use the indicator in a number of applications.

For example, the indicator values at multiple evaluation points can be compared with a threshold to create a contour which predicts the pattern shapes which are expected to print on a wafer. Alternatively, the indicator value can be used during OPC. The indicator value can also be used to identify regions in the layout that are expected to have manufacturing problems.

Note that the processes illustrated in FIGS. 5 and 6 are not intended to be exhaustive or to limit the present invention to the forms disclosed. Accordingly, many modifications and variations will be apparent to practitioners skilled in the art. For example, the EUVL model may include only two components: a short-range component and a medium-range component. Alternatively, the EUVL model may include more than three components. In yet another embodiment, the long-range component may not be a polynomial.

Figure 7:
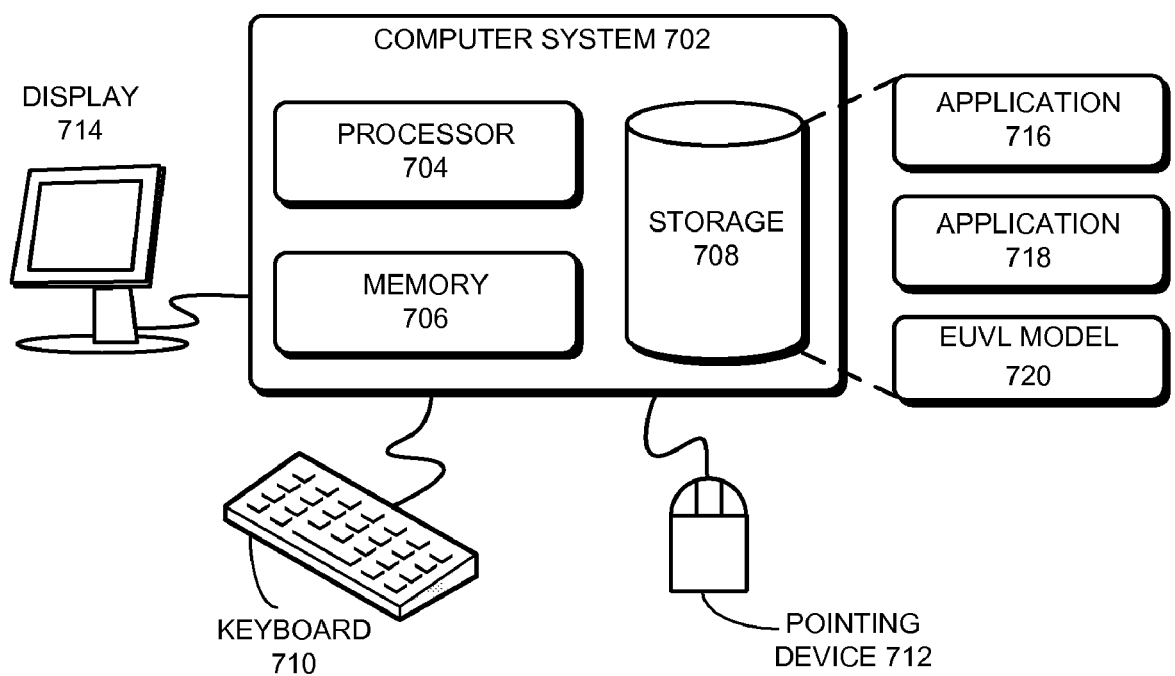
FIG. 7 illustrates a computer system in accordance with an embodiment of the present invention.

FIG. 7 illustrates a computer system in accordance with an embodiment of the present invention.

Computer system 702 comprises processor 704, memory 706, and storage device 708. Computer system 702 can be coupled with display 714, keyboard 710, and pointing device 712. Storage device 708 can store applications 716 and 718, and EUVL model 720.

During operation, computer system 702 can load application 716 into memory 706. Next, the system can use application 716 to determine EUVL model 720. Application 716 can then store EUVL model 720 on storage device 708. The system can store an EUVL model by storing the parameters and/or coefficients in a computer-readable storage medium. In one embodiment, the system may store parameters, coefficients, kernel identifiers, and information that associates the parameters and coefficients with their respective kernel identifiers. A kernel identifier can be a string that identifies a kernel, or it can be an expression that represents the kernel. Next, the system can load application 718 into memory 706. Application 718 can then load EUVL model 720 into memory 706, and use EUVL model 720 to determine a proximity correction or to predict the shape of a pattern on a photoresist layer.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for modeling long-range extreme ultraviolet lithography (EUVL) flare, the method comprising:
   receiving an evaluation point in a layout;
   receiving an EUVL model, which includes:
      a short-range component which includes one or more discretized kernels which are discretized using a high sampling rate over a small-sized ambit; and
      a medium-range component which includes one or more discretized kernels which are discretized using a medium sampling rate over a medium-sized ambit;
   determining an indicator at the evaluation point, wherein the indicator indicates whether a pattern is expected to print at the evaluation point, and wherein determining the indicator includes:
      convolving, at the evaluation point, the short-range component with the layout over the small-sized ambit; and
      convolving, at the evaluation point, the medium-range component with the layout over the medium-sized ambit; and
   storing the indicator, thereby enabling a user to determine whether the pattern is expected to print at the evaluation point.

2. The method of claim 1,
   wherein the EUVL model includes a long-range component which is a polynomial function of the layout's pattern density over a large-sized ambit; and
   wherein determining the indicator includes evaluating the polynomial function using the layout's pattern density at the evaluation point over the large-sized ambit.

3. The method of claim 2, wherein the layout's pattern density values are pre-computed and stored in a database so that the layout's pattern density values are quickly determined by querying the database while evaluating the polynomial function.

4. The method of claim 1, wherein prior to receiving the EUVL model, the method includes:
   receiving an uncalibrated EUVL model, which includes:
      an uncalibrated short-range component which includes one or more discretized kernels which are discretized using the high sampling rate over the small-sized ambit; and
      an uncalibrated medium-range component which includes one or more discretized kernels which are discretized using the medium sampling rate over the medium-sized ambit;
   receiving process data which is generated by:
      creating features on a wafer by subjecting a set of test layouts to an EUVL system which is desired to be modeled; and
      measuring dimensions of the features; and
   determining the EUVL model by fitting the uncalibrated EUVL model to the process data, wherein the EUVL model models the EUVL system.

5. The method of claim 1, wherein the indicator is used to predict pattern shapes which are expected to print on a wafer.

6. The method of claim 1, wherein the indicator is used to perform optical proximity correction on the layout.

7. The method of claim 1, wherein the indicator is used to identify regions in the layout that are expected to have manufacturing problems.

8. A computer-readable storage medium storing instructions that when executed by a computer cause the computer to perform a method for modeling long-range extreme ultraviolet lithography (EUVL) flare, the method comprising:
   receiving an evaluation point in a layout;
   receiving an EUVL model, which includes:
      a short-range component which includes one or more discretized kernels which are discretized using a high sampling rate over a small-sized ambit; and
      a medium-range component which includes one or more discretized kernels which are discretized using a medium sampling rate over a medium-sized ambit;
   determining an indicator at the evaluation point, wherein the indicator indicates whether a pattern is expected to print at the evaluation point, and wherein determining the indicator includes:
      convolving, at the evaluation point, the short-range component with the layout over the small-sized ambit; and
      convolving, at the evaluation point, the medium-range component with the layout over the medium-sized ambit; and
   storing the indicator, thereby enabling a user to determine whether the pattern is expected to print at the evaluation point.

9. The computer-readable storage medium of claim 8,
   wherein the EUVL model includes a long-range component which is a polynomial function of the layout's pattern density over a large-sized ambit; and
   wherein determining the indicator includes evaluating the polynomial function using the layout's pattern density at the evaluation point over the large-sized ambit.

10. The computer-readable storage medium of claim 9, wherein the layout's pattern density values are pre-computed and stored in a database so that the layout's pattern density values are quickly determined by querying the database while evaluating the polynomial function.

11. The computer-readable storage medium of claim 8, wherein prior to receiving the EUVL model, the method includes:
   receiving an uncalibrated EUVL model, which includes:
      an uncalibrated short-range component which includes one or more discretized kernels which are discretized using the high sampling rate over the small-sized ambit; and
      an uncalibrated medium-range component which includes one or more discretized kernels which are discretized using the medium sampling rate over the medium-sized ambit; receiving process data which is generated by:
      creating features on a wafer by subjecting a set of test layouts to an EUVL system which is desired to be modeled; and
      measuring dimensions of the features; and
   determining the EUVL model by fitting the uncalibrated EUVL model to the process data, wherein the EUVL model models the EUVL system.

12. The computer-readable storage medium of claim 11, wherein the uncalibrated EUVL model includes an uncalibrated long-range component which is a polynomial function of the layout's pattern density over a large-sized ambit.

13. The computer-readable storage medium of claim 8, wherein the indicator is used to predict pattern shapes which are expected to print on a wafer.

14. The computer-readable storage medium of claim 8, wherein the indicator is used to perform optical proximity correction on the layout.

15. A method for modeling long-range extreme ultraviolet lithography (EUVL) flare, the method comprising:
   receiving an uncalibrated EUVL model, which includes:
      an uncalibrated short-range component which includes one or more discretized kernels which are discretized using a high sampling rate over a small-sized ambit; and
      an uncalibrated medium-range component which includes one or more discretized kernels which are discretized using a medium sampling rate over a medium-sized ambit; receiving process data which is generated by:
      creating features on a wafer by subjecting a set of test layouts to an EUVL system which is desired to be modeled; and
      measuring dimensions of the features;
   determining a calibrated EUVL model by fitting the uncalibrated EUVL model to the process data, wherein the calibrated EUVL model models the EUVL system; and
   storing the calibrated EUVL model, thereby enabling a user to use the calibrated EUVL model to predict the EUVL system's behavior.

16. The method of claim 15, wherein the uncalibrated EUVL model includes an uncalibrated long-range component which is a polynomial function of the layout's pattern density over a large-sized ambit.

17. The method of claim 15, wherein the calibrated EUVL model is used to perform optical proximity correction.

18. A computer-readable storage medium storing instructions that when executed by a computer cause the computer to perform a method for modeling long-range extreme ultraviolet lithography (EUVL) flare, the method comprising:
   receiving an uncalibrated EUVL model, which includes:
      an uncalibrated short-range component which includes one or more discretized kernels which are discretized using a high sampling rate over a small-sized ambit; and
      an uncalibrated medium-range component which includes one or more discretized kernels which are discretized using a medium sampling rate over a medium-sized ambit;
   receiving process data which is generated by:
      creating features on a wafer by subjecting a set of test layouts to an EUVL system which is desired to be modeled; and
      measuring dimensions of the features;
   determining a calibrated EUVL model by fitting the uncalibrated EUVL model to the process data, wherein the calibrated EUVL model models the EUVL system; and
   storing the calibrated EUVL model, thereby enabling a user to use the calibrated EUVL model to predict the EUVL system's behavior.

19. The computer-readable storage medium of claim 18, wherein the uncalibrated EUVL model includes an uncalibrated long-range component which is a polynomial function of the layout's pattern density over a large-sized ambit.

20. The computer-readable storage medium of claim 18, wherein the calibrated EUVL model is used to perform optical proximity correction.

* * * * *